(12) United States Patent
Noguchi et al.

(10) Patent No.: US 11,742,021 B2
(45) Date of Patent: Aug. 29, 2023

(54) MEMORY DEVICE WITH WRITE PULSE TRIMMING

(71) Applicant: Taiwan Semiconductor Manufacturing Company, Ltd., Hsinchu (TW)

(72) Inventors: Hiroki Noguchi, Hsinchu (TW); Yu-Der Chih, Hsin-Chu (TW); Yih Wang, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 17/815,076

(22) Filed: Jul. 26, 2022

(65) Prior Publication Data

US 2022/0366982 A1 Nov. 17, 2022

Related U.S. Application Data

(62) Division of application No. 17/140,605, filed on Jan. 4, 2021, now Pat. No. 11,605,427.

(51) Int. Cl.
| | | |
|---|---|---|
| *G11C 7/10* | (2006.01) | |
| *G11C 7/22* | (2006.01) | |
| *G11C 13/00* | (2006.01) | |
| *G11C 11/22* | (2006.01) | |
| *G11C 11/16* | (2006.01) | |

(52) U.S. Cl.
CPC ...... *G11C 13/0069* (2013.01); *G11C 11/1675* (2013.01); *G11C 11/2275* (2013.01); *G11C 2013/0092* (2013.01)

(58) Field of Classification Search
CPC ............ G11C 13/0069; G11C 11/1675; G11C 11/2275; G11C 2013/0092; G11C 13/0033; G11C 2029/0409; G11C 2029/0411; G11C 7/04; G11C 29/021; G11C 29/028; G11C 29/52; G11C 29/56008; G11C 7/1096; G11C 7/24; G11C 7/22; G11C 29/022; G11C 2207/229
See application file for complete search history.

(56) References Cited

U.S. PATENT DOCUMENTS

| | | | | |
|---|---|---|---|---|
| 7,460,394 B2* | 12/2008 | Happ | ................. | G11C 13/0069 365/163 |
| 11,170,833 B2* | 11/2021 | Zhao | ................... | G11C 11/1673 |
| 2006/0023546 A1* | 2/2006 | Park | ................... | G11C 11/40626 365/222 |
| 2008/0211572 A1* | 9/2008 | Riho | ....................... | G11C 7/04 327/543 |

(Continued)

FOREIGN PATENT DOCUMENTS

| | | |
|---|---|---|
| CN | 103810119 B | 1/2017 |
| KR | 10-2014-0070441 A | 6/2014 |

*Primary Examiner* — Hien N Nguyen
(74) *Attorney, Agent, or Firm* — Merchant & Gould P.C.

(57) ABSTRACT

A memory device includes: a memory cell array comprising a plurality of memory cells; a temperature sensor configured to detect a temperature of the memory cell array; a write circuit configured to write data into the plurality of memory cells; and a controller coupled to the temperature sensor and the write circuit, wherein the controller is configured to determine a target write pulse width used by the write circuit based on the detected temperature of the memory device.

20 Claims, 4 Drawing Sheets

(56) References Cited

U.S. PATENT DOCUMENTS

| | | |
|---|---|---|
| 2009/0073769 A1 | 3/2009 | Ronen |
| 2014/0157065 A1 | 6/2014 | Ong |
| 2014/0204694 A1 | 7/2014 | Choy |
| 2015/0206566 A1 | 7/2015 | Bose et al. |
| 2016/0118131 A1 | 4/2016 | Dong et al. |
| 2016/0172046 A1 | 6/2016 | Moon et al. |
| 2017/0011793 A1* | 1/2017 | Shamanna ............... G11C 7/22 |
| 2017/0221571 A1 | 8/2017 | Joo |
| 2018/0059975 A1* | 3/2018 | Samson ................ G06F 3/0629 |
| 2019/0139590 A1 | 5/2019 | Berger et al. |
| 2020/0241840 A1 | 7/2020 | Ikegami et al. |

\* cited by examiner

FIG. 2

202 — Detect a temperature of the memory cell array

204 — Determine a target write pulse width based on the detected temperature of the memory device 206 — Write data to the memory device using the target write pulse width

FIG. 3A

| Temperature (°C) | -25 | 0 | 25 | 45 | 60 | 85 | 105 | 125 |
|---|---|---|---|---|---|---|---|---|
| Target Write Pulse Width | 5x | 3.5x | 2.7x | 2.2x | 2x | 1.5x | 1.2x | 1x |

FIG. 3B

| Temperature (°C) | -25 | 0 | 25 | 45 | 60 | 85 | 105 | 125 |
|---|---|---|---|---|---|---|---|---|
| Target Write Pulse Width | 5x | 5x | 3x | 3x | 2x | 2x | 1x | 1x |

MEMORY DEVICE WITH WRITE PULSE TRIMMING

CROSS-REFERENCE TO RELATED APPLICATIONS

This application is a division of U.S. patent application Ser. No. 17/140,605, filed on Jan. 4, 2021, the disclosure of which is hereby incorporated herein by reference in its entirety.

BACKGROUND

Memory devices are used to store information in semiconductor devices and systems. A nonvolatile memory device is capable of retaining data even after power is cut off. Examples of nonvolatile memory devices include flash memory, ferroelectric random access memories (FRAMs), magnetic random access memories (MRAMs), resistive random access memories (RRAMs), and phase-change memories (PCMs). MRAM, RRAM, FRAM, and PCM are sometimes referred to as emerging memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

FIG. 2 is a flowchart illustrating a method of write pulse trimming in accordance with some embodiments.

FIG. 3A is a diagram illustrating an example temperature dependent table used in the method of FIG. 2 in accordance with some embodiments.

FIG. 3B is a diagram illustrating another example temperature dependent table used in the method of FIG. 2 in accordance with some embodiments.

DETAILED DESCRIPTION

Figure 1:
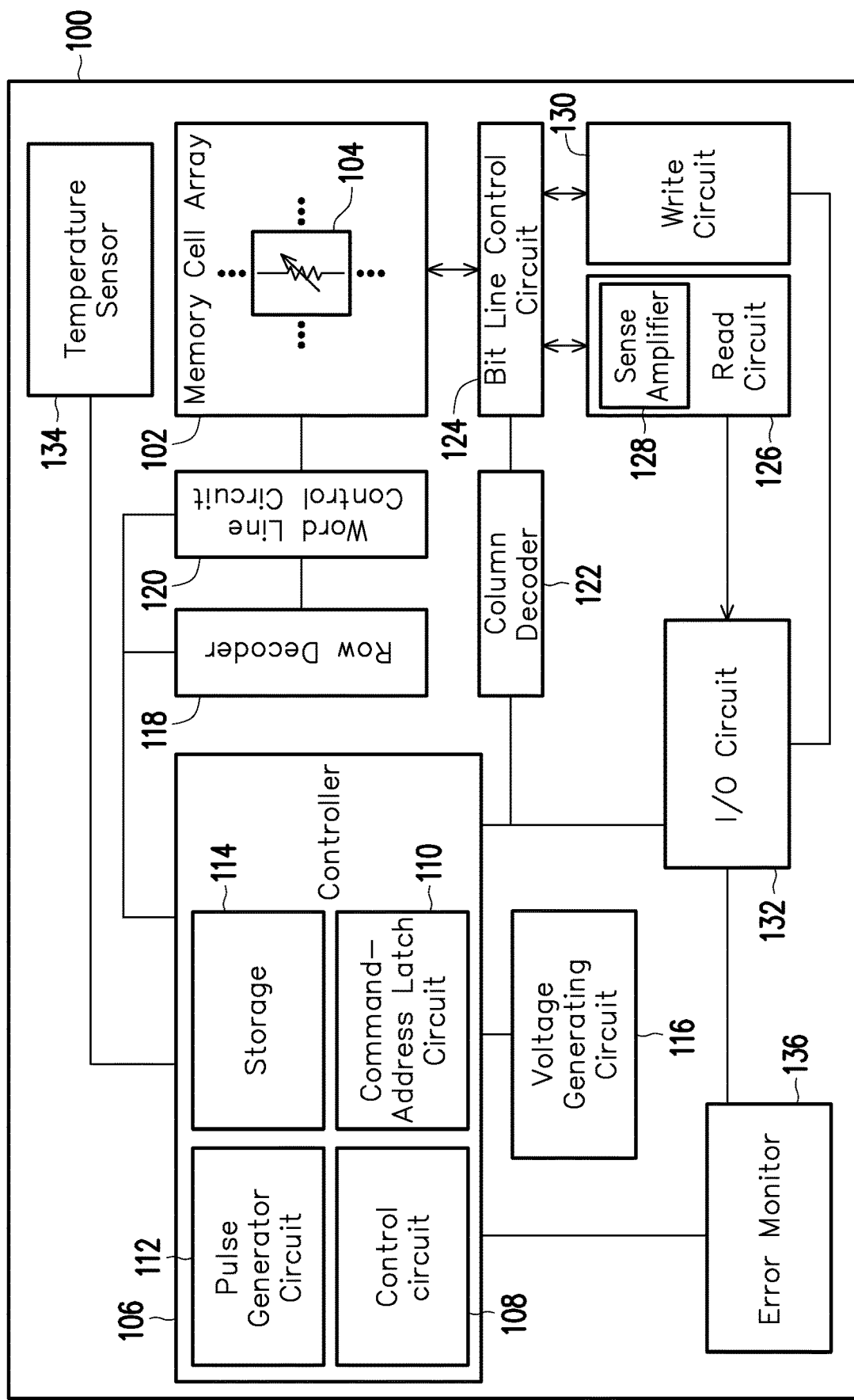
FIG. 1 is a block diagram illustrating an example memory device incorporating write pulse trimming in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fabrication processes for emerging memory devices are still not mature. Write error rates (WER) of emerging memory devices such as ferroelectric random access memories (FRAMs), magnetic random access memories (MRAMs), resistive random access memories (RRAMs), and phase-change memories (PCMs) are temperature dependent. Specifically, the difficulty of programming during write operation is affected by the temperature of the emerging memory device. When the temperature is relatively high, it is relatively easy to program data into memory cells of the emerging memory device, thus relatively fewer write pulses (i.e., lower write pulse width) are needed; when the temperature is relatively low, it is relatively hard to program data into memory cells of the emerging memory device, thus relatively more write pulses (i.e., higher write pulse width) are needed. An example normal temperature range of a memory device is between 25° C. and 85° C. However, sometimes memory devices may operate under extreme temperature conditions such as down to −25° C. or up to 125° C. In one example, the number of write pulses needed at 125° C. are about 6 times of the write pulses needed at −50° C. As such, fixed write pulses cannot fit all write operations in all conditions. In other words, when a fixed programming condition is set, it may merely be suitable or optimized for write operations at a specified temperature, and the write error rate may increase when the actual temperature deviates from the specified temperature.

In accordance with some aspects of the present disclosure, the write pulse width of the memory device is adjusted (i.e., write pulse trimming) based on the temperature of the memory cell array or the write error rate of the memory device. The adjustment makes the memory device operate under a suitable condition to decrease the write error rate. Specifically, the write pulse width of the memory device is adjusted based on the temperature of the memory as well as a temperature dependent table. Alternatively, the write pulse width is adjusted based on the write error rate of the memory device.

FIG. 1 is a block diagram illustrating an example memory device 100 incorporating write pulse trimming in accordance with some embodiments. In the example shown, the example memory device 100 includes, among other things, a memory cell array 102, a controller 106, a voltage generating circuit 116, a row decoder 118, a word line control circuit 120, a column decoder 122, a bit line control circuit 124, a read circuit 126, a write circuit 130, an input/output (I/O) circuit 132, optionally a temperature sensor 134, and optionally an error monitor 136. In one example, the memory device 100 includes the temperature sensor 134. In another example, the memory device 100 includes the error monitor 136. In yet another example, the memory device 100 includes both the temperature sensor 134 and the error monitor 136.

The memory cell array 102 includes multiple memory cells 104 arranged in rows and columns. The memory cells 104 are emerging memory cells such as MRAM cells, RRAM cells, FRAM cells, and PCM cells, though other types of memory cells may also be employed.

The controller 106 includes, among other things, a control circuit 108, a command-address latch circuit 110, a pulse generator circuit 112, and a storage 114. The command-address latch circuit 110 temporarily holds commands and addresses received by the memory device 100 as inputs. The command-address latch circuit 110 transmits the commands to the control circuit 108. The command-address latch circuit 110 transmits the addresses to the row decoder 118 and the column decoder 122.

The row decoder 118 decodes a row address included in the address and sends the row address to the word line control circuit 120. The word line control circuit 120 selects a word line (corresponding to a specific row) of the memory cell array 102 based on the decoded row address. Specifically, the memory cells 104 in that specific row are accessed.

On the other hand, the column decoder 120 decodes a column address included in the address and sends the column address to the bit line control circuit 124. The bit line control circuit 124 selects a bit line (corresponding to a specific column) of the memory cell array 102 based on the decoded column address. Specifically, the memory cell 104 in that specific column, among all the memory cells 104 in that specific row, is accessed and data can be written to or read from the memory cell 104 in that specific row and specific column.

During a write operation, the write circuit 130 supplies various voltages and currents for data writing to the memory cell 104 selected based on the decoded row address and the decoded column address. The write pulses needed (i.e., the write pulse width) for the write operation is generated by the pulse generator circuit 112. In the illustrated example of FIG. 1, the pulse generator circuit 112 is located in the controller 106, though the pulse generator circuit 112 may be a separate component outside the controller 106. The write circuit 130 includes, among other things, a write driver not shown.

During a read operation, the read circuit 126 supplies various voltages and currents for data reading from the memory cell 104 selected based on the decoded row address and the decoded column address. The read circuit 126 includes, among other things, a read driver not shown and a sense amplifier 128. The sense amplifier 128 senses a relatively small difference between the voltages of two complementary bit lines (i.e., BL and BLB) and amplifies the difference at the output of the sense amplifier 128.

The I/O circuit 132 is coupled to both the write circuit 130 and the read circuit 126. During the write operation, the I/O circuit 132 temporarily holds data to be written and transmits the data to be written to the write circuit 130. On the other hand, during the read operation, the I/O temporarily holds data read by the read circuit 126.

The voltage generation circuit 116 generates various voltages used for the operation of the memory device 100 by using power supply voltages outside the memory device 100. The various voltages generated by the voltage generation circuit 116 may be applied to components of the memory device 100 such as the controller 110, the row decoder 118, the word line control circuit 120, the column decoder 122, the bit line control circuit 124, the read circuit 126, the write circuit 130, the I/O circuit 132, and optionally the temperature sensor 134 and/or the error monitor 136.

The control circuit 108 receives the commands from the command-address latch circuit 110. In response to the commands, the control circuit 108 controls operations of components of the memory device 100 such as the controller 110, the row decoder 118, the word line control circuit 120, the column decoder 122, the bit line control circuit 124, the read circuit 126, the write circuit 130, the I/O circuit 132, the pulse generator circuit 112, the storage 114, the command-address latch circuit 110, the storage, the voltage generating circuit 116, and optionally the temperature sensor 134 and/or the error monitor 136.

The temperature sensor 134 measures the temperature of the memory cell array 102. In one example, the temperature sensor 134 is an analog temperature transducer that produces an output current proportional to absolute temperature of the temperature sensor 134 with a wide temperature range from −55° C. to 150° C. In another example, the temperature sensor 134 is a digital temperature that compares a voltage generated by an on-board temperature sensor to an internal voltage reference and digitized by an analog-to-digital converter (ADC). It should be noted that other types of temperature sensors may also be employed. The temperature sensor 134 may be a separate component as shown in FIG. 1. The temperature sensor 134 may also be embedded in the controller 106.

The error monitor 136 monitors the write error rate (WER) of the memory device 100. Write error rate is the number of write bit errors per unit time. Within a certain interval, the more write bit errors there are, the higher the write error rate is. During the write operation, some bits are not written as intended after the first write operation, and those bits are called unfinished bits. Due to unfinished bits, the second write operation is needed. If there is still any bit unfinished after the second write operation, the third write operation is needed. This process keeps going until there are no unfinished bits. The error monitor 136 is coupled to the I/O circuit 132 to monitor the write error rate of the memory device 100.

The error monitor 136 may employ various methods of write error rate detection such as error correction code (ECC), though other methods may also be employed. ECC schemes are used to detect and correct bit errors stored in a memory. ECC encodes data by generating ECC check bits, e.g., redundancy bits or parity bits, which are stored along with the data in a memory device. Data bits and check (e.g., parity) bits together form a codeword. For example, an ECC that generates 8 parity bits for 64 bits of data can usually detect two bit errors and correct one bit error in the 64 bits of data, known as a DED/SEC code, meaning double-error detecting (DED) and single-error correcting (SEC). In another example, a DED/DEC scheme, meaning double-error detecting (DED) and double-error correcting (DEC), may be employed. In yet another example, a SED/SEC scheme, meaning single-error detecting (SED) and single-error correcting (SEC), may be employed. In one embodiment, the error monitor 136 may be an ECC circuit utilizing an ECC scheme. The ECC circuit can detect errors and correct them during the operation of the memory device. Specifically, the ECC circuit may include, among other things, an ECC encoder and an ECC decoder. The ECC encoder is configured to generate parity bits and form a codeword, while the ECC decoder is configured to decode the codeword and provide corrected data. The ECC circuit may therefore determine the write error rate by taking advantage of the error detection function of the ECC circuit.

The storage 114 stores among other things, temperature dependent table(s) and/or a threshold write error rate which are described below in detail with reference to FIG. 2 and FIG. 4, respectively. In one example, the storage 114 is a read-only memory (ROM). In another example, the storage 114 is a random-access memory (RAM). It should be noted that other types of storage may also be employed.

Figure 3C:
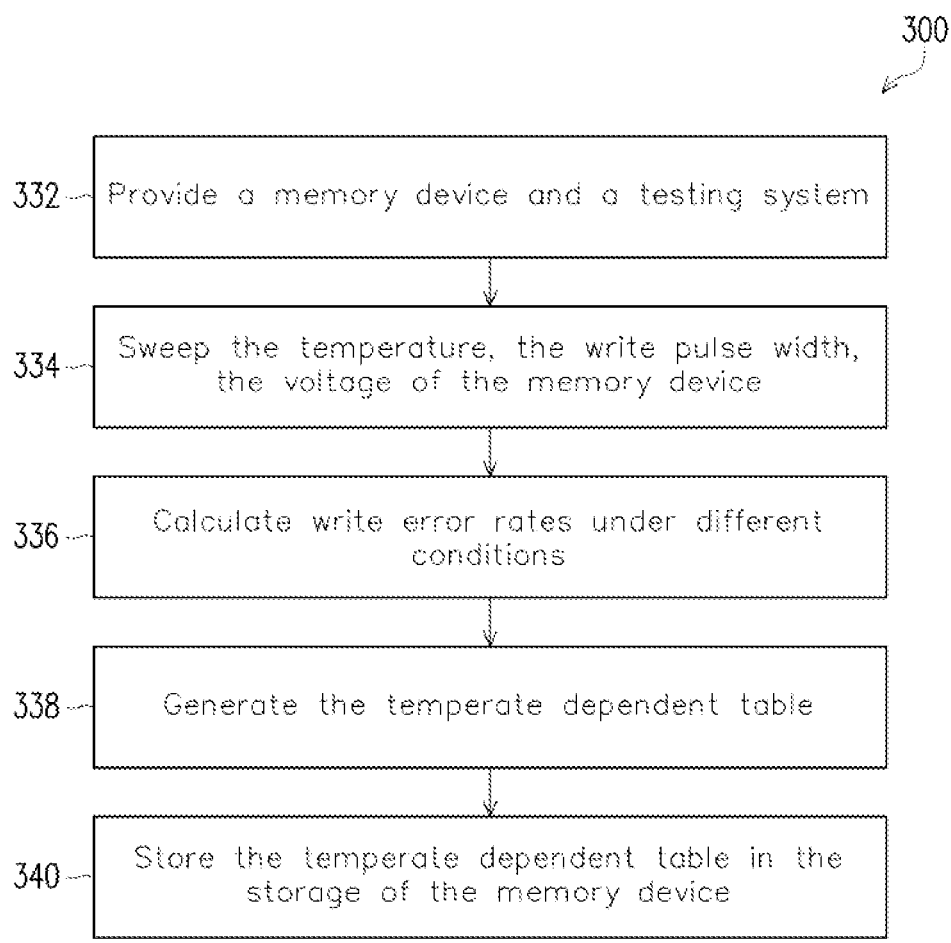
FIG. 3C is a flow chart illustrating a method of generating a temperature dependent table in accordance with some embodiments.

FIG. 2 is a flowchart illustrating a method of write pulse trimming in accordance with some embodiments. FIG. 3A is a diagram illustrating an example temperature dependent table used in the method of FIG. 2 in accordance with some embodiments. FIG. 3B is a diagram illustrating another example temperature dependent table used in the method of FIG. 2 in accordance with some embodiments. FIG. 3C is a flow chart illustrating a method of generating a temperature dependent table in accordance with some embodiments. In general, the write pulse width of the memory device 100 is adjusted based on the temperature of the memory cell array 102 so that the write operation is performed under a suitable condition to decrease the write error rate.

As shown in FIG. 2, the method begins at step 202, where a temperature of the memory cell array 102 is detected by the temperature sensor 134. Since the temperature sensor 134 is coupled to the controller 106, the controller can make decisions based on the temperature of the memory cell array 102. At step 204, a target write pulse width is determined based on the detected temperature of the memory device, as explained below with reference to FIGS. 3A-3C. In general, the target write pulse width is determined by referring to a temperature dependent table as shown in FIG. 3A or FIG. 3B below which serves as a look-up table. Various temperatures of the memory device correspond to various target write pulse widths.

In the illustrated example in FIG. 3A, an example temperature dependent table 302a serves as a look-up table. The temperature dependent table 302a provides the target write pulse width 306 according to the temperature 304 of the memory cell array 102. Specifically, when the temperature is 125° C., the target write pulse width is 1× (one unit); when the temperature is 105° C., the target write pulse width is 1.2×; when the temperature is 85° C., the target write pulse width is 1.5×; when the temperature is 60° C., the target write pulse width is 2×; when the temperature is 45° C., the target write pulse width is 2.2×; when the temperature is 25° C., the target write pulse width is 2.7×; when the temperature is 0° C., the target write pulse width is 3.5×; and when the temperature is −25° C., the target write pulse width is 5×. In other words, the lower the temperature 304 is, the larger the target write pulse width 306 becomes.

In the illustrated example in FIG. 3B, another example temperature dependent table 302b serves as another look-up table. The temperature dependent table 302b also provides the target write pulse width 306 according to the temperature 304 of the memory cell array 102. Specifically, when the temperature is 125° C., the target write pulse width is 1× (one unit); when the temperature is 105° C., the target write pulse width is 1×; when the temperature is 85° C., the target write pulse width is 2×; when the temperature is 60° C., the target write pulse width is 2×; when the temperature is 45° C., the target write pulse width is 3×; when the temperature is 25° C., the target write pulse width is 3×; when the temperature is 0° C., the target write pulse width is 5×; and when the temperature is −25° C., the target write pulse width is 5×. In other words, the lower the temperature 304 is, the larger the target write pulse width 306 becomes. Different from the temperature dependent table 302a, the temperature dependent table 302b has a lower resolution. For example, for both 25° C. and 45° C., the target write pulse width is 3× based on the temperature dependent table 302b. It should be noted that temperature dependent tables with higher resolutions or lower resolutions than those of the temperature dependent tables 302a and 203b may be employed as needed.

FIG. 3C is a flow chart illustrating a method 300 of generating a temperature dependent table in accordance with some embodiments. In general, a temperature dependent table (e.g., the temperature dependent table 302a or 302b shown in FIG. 3A or FIG. 3B, respectively) is generated during initial testing procedures before the shipment of the memory device. The method 300 starts at step 332 where a memory device (e.g., the memory device 100 shown in FIG. 1) and a testing system are provided. In one embodiment, the testing system is a memory tester which is used to test a memory device during initial testing procedures before the shipment. The memory tester may test whether the memory device operates normally. To test the memory device, the memory tester may transmit various signals to the memory device and may control an operation of the memory device. Various signals may include for example address signals, data, command signals, and clock signals. In some examples, the memory tester may transmit command signals, address signals, and data for the purpose of storing data in the memory device or reading data stored in the memory device. In some examples, the memory tester may store write data at a particular address of the memory device and may read data from the address at which the write data are stored. The memory tester may then compare the write data and the read data to determine whether the write operation is failed. Based on the results, the memory tester may calculate the write error rate of the memory device.

The method 300 then proceeds to step 334. At step 334, the memory tester sweeps the temperature, the write pulse width, and the voltage of the memory device. As such, various combinations of conditions (e.g., at temperature T1, at voltage V1, and with write pulse width WPW1) are provided. The method 300 then proceeds to step 336. At step 336, write error rates under different conditions are calculated. The write error rates may be calculated by counting write bit errors and dividing the write bit errors by a unit time. The method 300 then proceeds to step 338. At step 338, the temperate dependent table is generated based on the write error rates calculated under different conditions. Specifically, at a specific temperature Ti, the minimum write pulse width WPWi that can achieve an acceptable write error rate (e.g., below a threshold write error rate) is determined. In other words, at the specific temperature Ti, if the write pulse width is lower than the minimum write pulse width WPWi, the write error rate will be higher than the threshold write error rate. As such, the minimum write pulse width WPWi is the target write pulse width 306 corresponding to the specific temperature Ti. Since the memory tester sweeps the temperature of the memory device, the temperature dependent table that covers a temperature range (e.g., from −25° C. to 125° C.) is generated. The method 300 then proceeds to step 340. At step 340, the temperature dependent table is stored in the storage (e.g., the storage 114 shown in FIG. 1) of the memory device. As such, the temperature dependent table may be referred to after the shipment of the memory device.

The temperature dependent table 302a and/or the temperature dependent table 302b are stored in the storage 114 of the controller 106. It should be noted that the temperature dependent table 302a and/or the temperature dependent table 302b are examples, and other temperature dependent tables may be employed. Different temperature dependent tables may be employed for different applications such as mobile phones, smart watches, tablets, and digital cameras. As explained above, different applications may have different acceptable write error rates. As such, different temperature dependent tables may be employed due to different acceptable write error rates. In one example, temperature dependent tables may be configurable after shipment of the memory device. The manufacturer of the memory device provides different temperature dependent tables, corresponding to different applications, generated during the initial testing procedures. The user may configure/choose one suitable temperature dependent table for a specific application after the shipment as needed.

Referring back to FIG. 2, data are written to the memory device using the target write pulse width at step 206. The pulse generator circuit 112 of the controller 106 generates a write pulse with the target write pulse width 306, which is in turn used by the write circuit 130 in the write operation. Then the method loops back to step 202 again, in one example after a certain interval, to detect the temperature 304. In one example, the interval is configurable. In some applications (e.g., when used in industrial applications), the interval is relatively short such that the write pulse width may be adjusted relatively more frequently. On the other hand (e.g., when used in consumer electronics such as mobile phones, smart watches), the interval is relatively long such that the write pulse width may be adjusted relatively less frequently. The user may have the flexibility to configure the interval after shipment of the memory device. As such, the write pulse width is adjusted based on the temperature 304 of the memory cell array 102 as well as the temperature dependent table 302a or 302b. The adjustment makes the memory device 100 operate under a suitable condition to decrease the write error rate.

Figure 4:
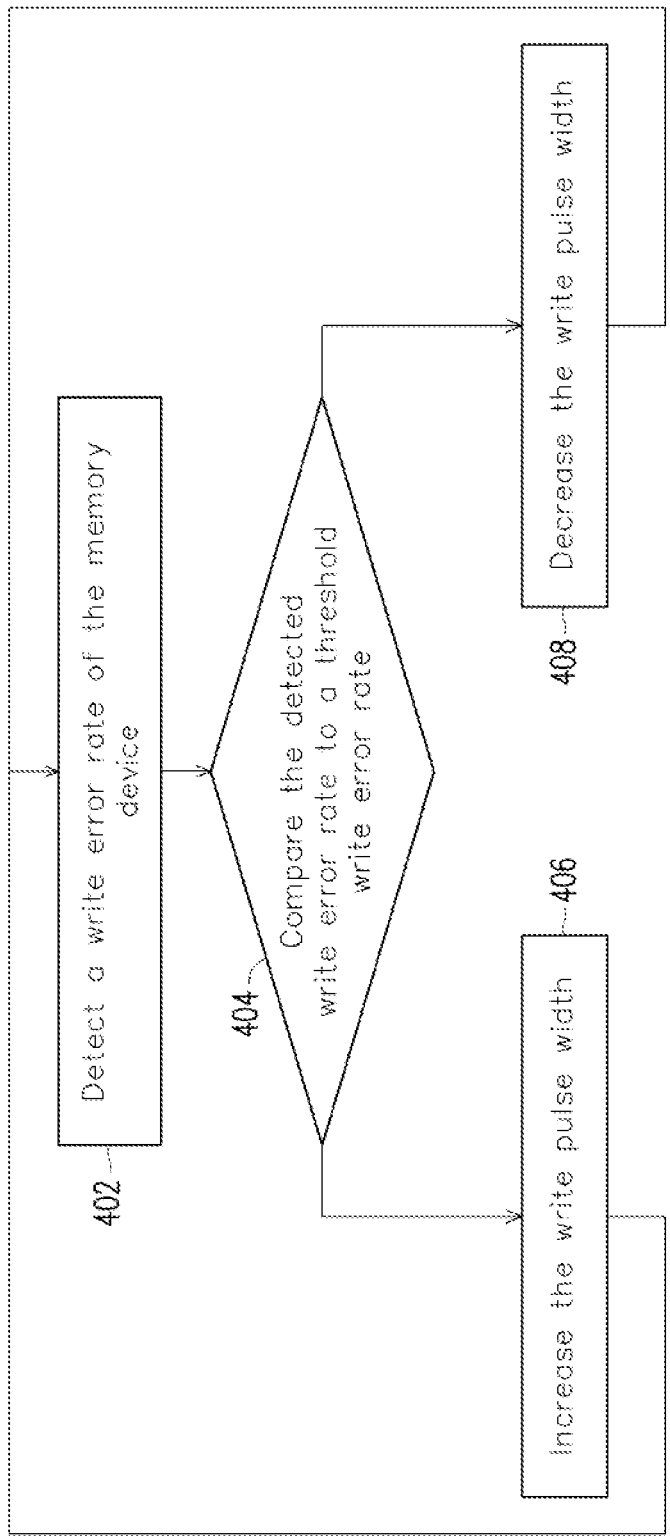
FIG. 4 is a flowchart illustrating another method of write pulse trimming in accordance with some embodiments.

FIG. 4 is a flowchart illustrating another method of write pulse trimming in accordance with some embodiments. In general, the write pulse width of the memory device 100 is adjusted dynamically based on the write error rate of the memory device 100 so that the write operation is performed under a suitable condition to decrease the write error rate.

As shown in FIG. 4, the method begins at step 402, where a write error rate of the memory device 100 is detected by the error monitor 136. Since the error monitor 136 is coupled to the controller 106, the controller can make decisions based on the write error rate of the memory device 100. At step 404, the controller 106 compares the detected write error rate to a threshold write error rate. The threshold write error rate is stored in the storage 114 of the controller 106. In one example, the threshold write error rate is associated with the number of data bits written in the second write operation. During the write operation, some bits are not written as intended after the first write operation, and those bits are called unfinished bits. Due to unfinished bits, the second write operation is needed. If there is still any bit unfinished after the second write operation, the third write operation is needed. This process keeps going until there are no unfinished bits. Thus, the number of data bits written in the second write operation can be used as a benchmark of write error rate. In other words, if the write error number is higher than the number of data bits written in the second write operation, the write error number is typically regarded as relatively high. Other threshold write error rates may be employed for different applications such as mobile phones, smart watches, tablets, and digital cameras. In one example, the threshold write error rate may be configurable. Depending on the result of step 404, the method proceeds to either step 406 or step 408.

When the controller 106 determines that the write error rate is higher than the threshold write error rate, the write pulse width is increased at step 406. When the controller 106 determines that the write error rate is not higher than the threshold write error rate, the write pulse width is decreased at step 408. The write pulse width is increased or decreased by the pulse generator circuit 112 of the controller 106. In one example, the write pulse width is increased or decreased by an amount proportionate to the difference between the write error rate and the threshold write error rate. In other words, the more the write error rate deviates from the threshold write error rate, the larger the increase amount or decrease amount is. Specifically, the controller 106 determines the difference between the write error rate and the threshold write error rate. Then the pulse generator circuit 112 increases or decreases the write pulse width based on the difference determined by the controller 106. The larger the determined difference is, the larger the increase step or decrease step is. As such, when the deviation of the write error rate from the threshold write error rate is large, the step of increase or decrease in the write pulse width is relatively large (i.e., like a coarse adjustment). As the deviation of the write error rate becomes smaller, the increase step or decrease step of the write pulse width becomes relatively small (i.e., like a fine adjustment). As such, the write pulse width adjustment is relatively quick while avoiding over-adjusting in the meantime due to large increase step or decrease step. In another example, the write pulse width is increased or decreased by a fixed amount. In other words, the fixed amount is predetermined. The fixed amount may be configured based on different applications such as mobile phones, smart watches, tablets, and digital cameras. Specifically, the pulse generator circuit 112 increases or decreases the write pulse width, regardless of the difference between the write error rate and the threshold write error rate. A predetermined increase step or decrease step may achieve simplicity of the relevant circuits.

After either step 406 or step 408, the method loops back to step 402 again, in one example after a certain interval, to detect the write error rate of the memory device 100 again. In one example, the interval is configurable. In some applications (e.g., when used in industrial applications), the interval is relatively short such that the write pulse width may be adjusted relatively more frequently. On the other hand (e.g., when used in consumer electronics such as mobile phones, smart watches), the interval is relatively long such that the write pulse width may be adjusted relatively less frequently. The user may have the flexibility to configure the interval after shipment of the memory device. As such, the write pulse width is adjusted based on the write error rate of the memory device 100. The adjustment makes the memory device 100 operate under a suitable condition to decrease the write error rate.

It should be noted that the method of FIG. 2 and the method of FIG. 4 may be combined. In other words, a memory device 100 may employ both the method of FIG. 2 and the method of FIG. 4. In that case, the memory device 100 includes both a temperature sensor 134 and an error monitor 136.

In accordance with some disclosed embodiments, a method is provided. The method includes: detecting a temperature of a memory device; determining a target write pulse width based on the detected temperature of the memory device; and writing data to the memory device using the target write pulse width.

In accordance with further disclosed embodiments, a method includes: detecting a write error rate of a memory device; comparing the detected write error rate to a threshold write error rate; if the detected write error rate is higher than the threshold write error rate, then increasing a write pulse width; and if the detected write error rate is not higher than the threshold write error rate, then decreasing the write pulse width.

In accordance with further disclosed embodiments, a memory device is provided. The memory device includes: a memory cell array comprising a plurality of memory cells; a temperature sensor configured to detect a temperature of the memory cell array; a write circuit configured to write data into the plurality of memory cells; and a controller coupled to the temperature sensor and the write circuit, wherein the controller is configured to determine a target write pulse width used by the write circuit based on the detected temperature of the memory device.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   detecting a write error rate of a memory device;
   comparing the detected write error rate to a threshold write error rate;
   if the detected write error rate is higher than the threshold write error rate, then increasing a write pulse width; and
   if the detected write error rate is not higher than the threshold write error rate, then decreasing the write pulse width.

2. The method of claim 1, wherein the memory device is one of: ferroelectric random access memories (FRAMs), magnetic random access memories (MRAMs), resistive random access memories (RRAMs), and phase-change memories (PCMs).

3. The method of claim 1, wherein the write pulse width is increased or decreased by a predetermined amount.

4. The method of claim 1, further comprising:
   storing the threshold write error rate in a storage of the memory device.

5. The method of claim 1, wherein the increasing the write pulse width comprises:
   generating a first write pulse with an increased write pulse width; and
   writing data to the memory device using the first write pulse.

6. The method of claim 1, wherein the decreasing the write pulse width comprises:
   generating a second write pulse with a decreased write pulse width; and
   writing data to the memory device using the second write pulse.

7. A memory device, comprising:
   a memory cell array comprising a plurality of memory cells;
   a temperature sensor configured to detect a temperature of the memory cell array;
   a write circuit configured to write data into the plurality of memory cells; and
   a controller coupled to the temperature sensor and the write circuit, wherein the controller is configured to determine a target write pulse width used by the write circuit based on the detected temperature of the memory cell array.

8. The memory device of claim 7, wherein the memory device is one of: ferroelectric random access memories (FRAMs), magnetic random access memories (MRAMs), resistive random access memories (RRAMs), and phase-change memories (PCMs).

9. The memory device of claim 7, further comprising:
   an error monitor coupled to the controller configured to detect a write error rate of the memory device; and
   wherein the controller is further configured to:
   compare the detected write error rate to a threshold write error rate;
   if the detected write error rate is higher than the threshold write error rate, then increase the target write pulse width; and
   if the detected write error rate is not higher than the threshold write error rate, then decrease the target write pulse width.

10. The memory device of claim 7, further comprising:
    a storage storing a temperature dependent table, wherein the control is configured to determine the target write pulse width by using the temperature dependent table.

11. The memory device of claim 10, wherein the temperature dependent table includes a plurality of temperature dependent tables corresponding to a plurality of applications.

12. The memory device of claim 7, further comprising:
    a pulse generator circuit coupled to the write circuit and configured to generate a write pulse with the target write pulse width used by the write circuit.

13. A memory device comprising:
    an error monitor configured to detect a write error rate of the memory device;
    a controller configured to compare the detected write error rate to a threshold write error rate; and
    a pulse generator circuit configured to increase a write pulse width if the detected write error rate is higher than the threshold write error rate, and to decrease the write pulse width if the detected write error rate is not higher than the threshold write error rate.

14. The memory device of claim 13, wherein the memory device is one of: ferroelectric random access memories (FRAMs), magnetic random access memories (MRAMs), resistive random access memories (RRAMs), and phase-change memories (PCMs).

15. The memory device of claim 13, wherein the pulse generator circuit is configured to increase or decrease the write pulse width by a predetermined amount.

16. The memory device of claim 13, further comprising:
    a storage device configured to store the threshold write error rate.

17. The memory device of claim 13, wherein the pulse generator circuit is configured to increase the write pulse width by:
    generating a first write pulse with an increased write pulse width; and
    writing data to the memory device using the first write pulse.

18. The memory device of claim 13, wherein the pulse generator circuit is configured to decrease the write pulse width by:

generating a second write pulse with a decreased write pulse width; and writing data to the memory device using the second write pulse.

19. The memory device of claim 13, wherein the pulse generator circuit is configured to increase or decrease the write pulse width by an amount proportionate to a difference between the write error rate and the threshold write error rate.

20. The memory device of claim 19, wherein:

the control is configured to determine the difference between the write error rate and the threshold write error rate.

* * * * *